United States Patent
Bryngelsson et al.

(10) Patent No.: US 10,365,331 B2
(45) Date of Patent: Jul. 30, 2019

(54) METHOD FOR DETERMINING THE RELIABILITY OF STATE OF HEALTH PARAMETER VALUES

(71) Applicant: VOLVO TRUCK CORPORATION, Göteborg (SE)

(72) Inventors: Hanna Bryngelsson, Göteborg (SE); Niklas Legnedahl, Onsala (SE)

(73) Assignee: Volvo Truck Corporation, Göteborg (SE)

( * ) Notice: Subject to any disclaimer, the term of this patent is extended or adjusted under 35 U.S.C. 154(b) by 188 days.

(21) Appl. No.: 15/307,709

(22) PCT Filed: May 28, 2014

(86) PCT No.: PCT/EP2014/001427
§ 371 (c)(1),
(2) Date: Oct. 28, 2016

(87) PCT Pub. No.: WO2015/180743
PCT Pub. Date: Dec. 3, 2015

(65) Prior Publication Data
US 2017/0067967 A1    Mar. 9, 2017

(51) Int. Cl.
*B60L 3/12*    (2006.01)
*B60L 58/12*   (2019.01)
(Continued)

(52) U.S. Cl.
CPC ............ *G01R 31/367* (2019.01); *B60L 3/12* (2013.01); *B60L 58/12* (2019.02); *B60L 58/16* (2019.02);
(Continued)

(58) Field of Classification Search
CPC .................................................. G01R 31/3651
See application file for complete search history.

(56) References Cited

U.S. PATENT DOCUMENTS

2006/0284617 A1   12/2006   Kozlowski et al.
2007/0262750 A1   11/2007   Yun et al.
(Continued)

FOREIGN PATENT DOCUMENTS

EP   1 873 542 A1   1/2008
EP   2 410 346 A1   1/2012
(Continued)

OTHER PUBLICATIONS

Japanese Official Action (dated Mar. 13, 2018) for corresponnding Japanese App. 2016-569854.
(Continued)

*Primary Examiner* — Manuel A Rivera Vargas
(74) *Attorney, Agent, or Firm* — WRB-IP LLP

(57) ABSTRACT

A method is provided for determining the reliability of state of health parameter values for a battery including a plurality of battery cells, the method including the steps of receiving, for a state of health parameter, a plurality of measured parameter values for the battery, comparing the measured parameter values with at least one predetermined parameter criterion; and determining that the measured state of health parameter values are reliable if the state of health parameter values fulfill the at least one predetermined parameter criterion. A corresponding system, computer program, and computer readable medium are also provided.

16 Claims, 4 Drawing Sheets

(51) Int. Cl.

| | | |
|---|---|---|
| *B60L 58/16* | (2019.01) | |
| *H01M 10/42* | (2006.01) | |
| *H01M 10/48* | (2006.01) | |
| *G01R 31/367* | (2019.01) | |
| *G01R 31/392* | (2019.01) | |
| *G01R 31/396* | (2019.01) | |

(52) U.S. Cl.
CPC ......... *G01R 31/392* (2019.01); *G01R 31/396* (2019.01); *H01M 10/4257* (2013.01); *H01M 10/482* (2013.01); *B60L 2240/545* (2013.01); *B60L 2240/547* (2013.01); *B60L 2240/80* (2013.01); *Y02T 10/7005* (2013.01); *Y02T 10/705* (2013.01); *Y02T 10/7044* (2013.01)

(56) References Cited

U.S. PATENT DOCUMENTS

| | | | |
|---|---|---|---|
| 2010/0247988 A1 | 9/2010 | Okumura et al. | |
| 2011/0148424 A1 | 6/2011 | Chiang et al. | |
| 2011/0248680 A1* | 10/2011 | Timmons | H01M 2/1072 320/120 |
| 2012/0022816 A1 | 1/2012 | Zenati et al. | |
| 2012/0293131 A1 | 11/2012 | Nakamura et al. | |
| 2014/0184236 A1 | 7/2014 | Ohkawa et al. | |
| 2014/0266061 A1* | 9/2014 | Wachal | H02J 7/0068 320/134 |

FOREIGN PATENT DOCUMENTS

| | | |
|---|---|---|
| EP | 2 720 054 A1 | 4/2014 |
| FR | 2 975 501 A1 | 11/2012 |
| JP | 2004031254 A | 1/2004 |
| JP | 2010066232 A | 3/2010 |
| JP | 2010249797 A | 11/2010 |
| WO | 2012169061 A1 | 12/2012 |
| WO | 2011090020 A1 | 5/2013 |
| WO | 2014/202172 A2 | 12/2014 |

OTHER PUBLICATIONS

International Search Report (dated Jan. 27, 2015) for corresponding International App. PCT/EP2014/001427.

International Preliminary Report on Patentability (dated May 11, 2016) for corresponding International App. PCT/EP2014/001427.

Pop V et al: 11 Review Article; State-of-the-art of battery state-of-charge determination; Review Article. Measurement Science and Technology. IOP.Bristol. GB. vol • 16. No. 12. Oct. 31, 2005 (Oct. 31, 2005). pp. R93-R110, XP020090492. ISSN: 0957-0233. DOI: 10.1088/0957-0233/16/12/R01.

Kessels J T B A et al: 11 On-line battery identification for electric driving range prediction . 2011 IEEE Vehicle Power and Propulsion Conference (VPPC 2011) : Chicago. Illinois. USA. Sep. 6-9, 2011. IEEE. Piscataway. NJ. Sep. 6, 2011 (Sep. 6, 2011). pp. 1-6. XP031974812. DOI: 10.1109/VPPC.2011.6043022 ISBN: 978-1-61284-248-6.

Roscher Michael A et al: 11 Error detection for PHEV. BEV and stationary battery systems . Control Engineering Practice. vol. 21. No. 11. Nov. 1, 2013 (Nov. 1, 2013). pp. 1481-1487. XP028730072. ISSN: 0967-0661. DOI: 10.1016/J.CONENGPRAC.2013.07.003.

Plett G L: 11 Extended Kalman filtering for battery management systems of LiPB-based HEV battery packs—Part 1. Background . Journal of Power Sources, Elsevier SA. CH. vol • 134. No. 2. Aug. 12, 2004 (Aug. 12, 2004), pp. 252-261. XP004521735. ISSN: 0378-7753. DOI: 10.1016/J.JPOWSOUR.2004.02.031.

Michael A Roscher et al: 11 Detection of Utilizable Capacity Deterioration in Battery Systems . IEEE Transactions on Vehicular Technology. IEEE Service Center. Piscataway. NJ. US. vol • 60. No. 1. Jan. 1, 2011 (Jan. 1, 2011). pp. 98-103. XP011342176. ISSN: 0018-9545. DOI: 10.1109/TVT.2010.2090370.

* cited by examiner

METHOD FOR DETERMINING THE RELIABILITY OF STATE OF HEALTH PARAMETER VALUES

BACKGROUND AND SUMMARY

The present invention relates to a method for determining the reliability of state of health parameter values for a battery comprising a plurality of battery cells. The invention is applicable for determining the reliability of state of health parameter values for vehicle batteries, in particularly batteries for hybrid buses or hybrid truck vehicles. However, although the invention will mainly be described in relation to a bus, the invention is of course also applicable for other types of vehicle batteries, such as batteries for cars, industrial construction machines, wheel loaders, etc.

Vehicle batteries are continuously developed in order to e.g. be more durable as well as to function in a broader field of technology, such that the increasing demand from the market can be met. Especially, there is always a desire to reduce emissions from vehicles and there is hence an increased desire to use batteries for propelling the vehicles, either entirely or partly. For example, hybrid buses often have an electric motor which is configured to propel the bus at low speed, and when the speed exceeds a threshold speed limit, an internal combustion engine is started and takes over the propulsion of the vehicle.

The battery is hence arranged to supply electric energy to an external application, and is configured to receive energy in order to be charged. More specifically, the battery comprises a plurality of battery cells which either discharge energy or being charged with energy. The charging of the battery cells can be made when e.g. the vehicle is braking and a generator absorbs energy which is transferred to the battery cells.

One important aspect in the field of batteries is to sufficiently keep track of the status of the battery. It is, for example, important to be aware of e.g. the utilization of the battery in order to know when it is time to replace the battery with a new one. State of Health (SOH) is often used in order to determine aging of the battery as a comparison between a new condition and a deteriorated condition.

U.S. Pat. No. 8,269,502 describes a method for determining the State of Health of a battery. The method described in U.S. Pat. No. 8,269,502 continuously determines cell impedance as well as one or more confidence coefficients that depend on e.g. cell current, temperature or State of Charge.

However, U.S. Pat. No. 8,269,502 relates mainly to the determination of State of Health for a single cell of a battery, and there is hence a need to further improve the process of accurately determine State of Health for a complete battery comprising a plurality of battery cells.

US 2006/0284617 relates to an apparatus for determining a condition parameter of a battery. Amongst other things, US 2006/0284617 relates to state of health of a battery. Voltage, current and temperature signals are calibrated in order to insure that data is accurate.

EP 2 410 346 relates to a method for determining a parameter such as the resistance of at least one accumulator of a battery. EP 2 410 346 determines the absolute uncertainty of the resistance by using standard deviation and of a Student coefficient.

It is desirable to provide a method for determining if the parameters used when calculating state of health are reliable, i.e. if the measured parameters will enable for a substantially correct calculation of a battery state of health.

According to a first aspect of the present invention there is provided a method for determining the reliability of state of health parameter values for a battery comprising a plurality of battery cells, the method comprising the steps of: receiving, for a state of health parameter, a plurality of measured parameter values for the battery;

comparing the measured parameter values with at least one predetermined parameter criterion; and determining that the measured state of health parameter values are reliable if the state of health parameter values fulfil the at least one predetermined parameter criterion.

The wording "state of health parameter values" should in the following and throughout the entire description be interpreted as a parameter value which can be used when calculating the state of health of the battery. The state of health of a battery can be calculated rather differently depending on the specific battery application. Various ways of calculating the state of health for a battery are well known to the person skilled in the art and the following description will hence mainly focus on the description of the different parameters that can be used for calculating the state of health of the battery and not focus on the specific calculation.

Furthermore, it should be readily understood that the present invention relates to determining the reliability of state of health parameter values for a complete battery including a plurality of cells, and not to individual cells of a battery. The battery may include more than e.g. 50 battery cells, such as e.g. 200 cells.

Also, the "predetermined parameter criterion" should be understood as a criterion which can be different for different types of parameters. For example, a predetermined parameter criterion for a temperature parameter is naturally different compared to a predetermined parameter criterion for a voltage parameter. However, the predetermined parameter criterion may also be different for a specific parameter. For example, and as will be described further below, one predetermined parameter criterion may be that a cell temperature may not exceed a certain limit, while another predetermined parameter criterion may be that a temperature difference between the warmest battery cell and the coldest battery cell may not differ too much. Hence, there are two criteria for the temperature parameter. Also, the specific criterion may be set individually by the user and may thus be different depending on the specific application.

One way of measuring the state of health parameter values is to utilize a Kalman filter, also known as Linear Quadratic Estimation. Such methods are well known to the person skilled in the art of measuring parameters of a dynamic system, such as the battery, and will therefore not be described further.

The present invention is based on the insight that by determining if the parameter values for calculating battery state of health are reliable, a correctly calculated state of health can be made. Further, the parameter values which are used when calculating state of health of a battery may for a number of reasons, which will be further described below, not be reliable at certain conditions or states of the battery. The present invention aims at providing a solution where parameters measured at these conditions, or states, are sorted out as non-reliable.

An advantage of the present invention is that if it is determined that the state of health parameters are not reliable, a calculated state of health based on this non-reliable value will not be sufficiently correct and the method according to the present invention thus determines that the calculation should not be executed since the result will not provide a reliable indication of the state of health of the battery. Hence, the present invention provides a method which determines if it is suitable to calculate state of health of the battery with the measured parameter values. By only calculating state of health of the battery when the parameter values for doing so are reliable, a substantially correct calculation of the true state of the battery can be made. Furthermore, with the present invention it is possible to determine if the result from a state of health calculation with the above state of health parameter values will provide a more reliable and correct estimation of the battery state of health compared to what is already available for the user of the battery. Hereby, it may be determined to calculate the battery state of health if it will provide a result which is more correct and reliable than what is already available.

With the present invention, the predictability of, for example, when it is time to replace the battery with a new one will be increased. Hence, the user of the battery will be aware of the state of the battery and does not have to e.g. replace the battery too early or too late. Another advantage is that the operation of the battery can be controlled for optimized capacity for providing electrical capacity at approximately all times. This will in turn increase the fuel efficiency and hence reduce the total operational cost for the owner of the vehicle. Furthermore, the service intervals for calibration/determination of the battery age may also be adapted based on the accurately calculated state of health such that the time period of such intervals may be increased or decreased.

According to an example embodiment of the present invention, the at least one predetermined parameter criterion may be that the received plurality of parameter values for the battery are measured when the absolute value of the derivative function dy/dx is above a predetermined threshold limit, where:

y=a measured voltage of the battery; and
x=a calculated state of charge of the battery.

Hereby, it is determined that the calculation of state of health is not executed if the gradient of a voltage-state of charge curve is below a specific value. This is advantageous since if the derivative function is zero, or close to zero, it may be determined that a specific voltage value corresponds to a state of charge value which is either too high or too low in comparison to the "correct" state of charge value of the battery. Also, a small increase or decrease of the battery voltage will, if the gradient is close to zero, result in a rather large increase/decrease of the battery state of charge which therefore makes the use of such values inappropriate when calculating the battery state of health, since the accuracy of the calculated state of charge is not sufficient, which will provide an unreliable calculation of the state of health. The derivative function above is preferably applicable for a so called open cell voltage curve.

It should be readily understood that the person skilled in the art is well aware of how to calculate state of charge of a battery and a description of such calculation is therefore omitted from the description of the present invention. Moreover, the derivative function above may result in either a positive or a negative value, and it is therefore important to analyse the absolute value of such value when determining if the measured value is reliable to use in a state of health calculation. For e.g. an open cell voltage value, the derivative function generally always provides a positive value.

According to an example embodiment of the present invention, the at least one predetermined parameter criterion may be that a mean temperature of the battery cells is within a predetermined temperature range.

If the mean temperature of the battery cells is either too high or too low it may not be suitable to calculate the state of health of the battery since the temperature values may not sufficiently describe the true characteristic of the cells. Hereby, the method determines that it is not suitable to execute a state of health calculation for the battery. The mean temperature of the battery cells may for example be higher than "normal" in case the measurement of the cell temperature is made at a point in time when the battery is charged or discharged. Furthermore, it may be important to determine that the temperature is within a specific range, which range substantially corresponds to a test temperature range when modelling battery state of health. Hence, the temperature range should preferably be approximately the same as the test temperature range such that calculation errors due to temperature differences are reduced.

Also, other state of health parameter values may have a negative impact on a too warm or too cold battery, which thus not only make the temperature parameter value unreliable itself, but also the other state of health parameter values may be considered unreliable if the battery temperature is too high/low. The battery temperature is generally generated by the electric current of the battery. Hence, deviations in temperature may be the result of current flowing through the battery and the measured temperature may thus not provide a value which is accurate or reliable enough. Further, and as described below, the temperature measurement should preferably be made a predetermined time period after the battery has been charged or discharged in order to be sufficiently reliable. In case the temperature measurement is made before the end of the predetermined time period after the charging/discharging of the battery, the temperature may not have "converged" to its true limit, thus making such measured values less accurate/reliable.

According to an example embodiment of the present invention, the at least one predetermined parameter criterion may be that the measured parameter values were received a predetermined time period after a previous charging/discharging of the battery was executed.

Hereby, the battery will be allowed to "rest" sufficiently before the calculation is executed, which thus makes the calculated state of health reliable. A time period shortly after a charging/discharging of the battery may provide a too large deviation of the measured parameter for the different cells, and thus not provide a reliable calculation of the state of health. Hence, the battery is not in a steady state.

Furthermore, if the measured parameter value is e.g. the temperature, then it may be determined that the battery is not in a steady state if the temperature tends to increase/decrease during the period when receiving the parameter values.

Accordingly, if the temperature of the battery is increasing or decreasing during the period when receiving the parameter values, then it may be determined that charging/discharging of the battery was executed too close in time from the measurement. However, in cases where the measurement relates to battery state of charge, the time period since the previous state of charge calculation should not exceed a predetermined time period. As described above, the state of charge should be calculated when the derivative function is "high". Hence, a state of health calculation should be executed within a specific time period after such calculation of the battery state of charge. If the state of health calculation is made after a rather "long" period since the state of charge calculation was made, the state of charge value may not be sufficiently reliable.

According to an example embodiment of the present invention, the at least one predetermined parameter criterion may be that the values of the plurality of measured parameter values are within a predetermined range.

Hereby, the spread of the measured values must be within a predetermined range in order to be determined reliable. A battery is often sensitive to high and/or low temperatures and a large spread in temperatures between the different battery cells may thus not provide a sufficiently correct calculation of the battery state of health. The spread between the cells may be for any kind of state of health parameter, such as battery state of charge, battery voltage, battery temperature, etc. The various parameters will be described further below.

According to an example embodiment, the predetermined range may be measured from a mean value of the measured parameter values.

Hereby, it may be determined that a state of health calculation should not be performed if a measured value is deviating too much from a mean value of the measurement.

According to an example embodiment of the present invention, the state of health parameter may be cell temperature of the battery, such that a plurality of measured battery cell temperatures is received.

A battery is often sensitive to high and/or low temperatures, as described above. For example, a large spread in temperatures between the different battery cells may not provide a sufficiently correct calculation of the battery state of health. The temperature of the battery may also be an important parameter to consider when calculating state of health of a battery, since the battery temperature may affect other measured parameters of the battery, such as e.g. the battery voltage.

According to an example embodiment of the present invention, the state of health parameter may be cell voltage of the battery, such that a plurality of measured battery cell voltages is received.

Hereby, a further parameter which may be important when calculating state of health can be used for consideration.

According to an example embodiment of the present invention, the at least one predetermined parameter criterion may be that the measured cell voltage of each of the battery cells are below a predetermined upper voltage limit.

According to an example embodiment of the present invention, the at least one predetermined parameter criterion may be that the measured cell voltage of each of the battery cells are above a predetermined lower voltage limit.

If the cell voltage value is above a predetermined upper voltage limit or below a predetermined lower voltage limit, the cell having the low or high voltage value may for some reason be damaged. Hereby, calculating battery state of health based on such value may not provide a reliable result of the "true" state of health of the battery. Also, the measured cell voltage may be compared to a deviation from the mean value of the measured cell voltages and if the deviation is too severe, it may be an indication that the measured cell voltage will provide an unreliable state of health value.

Furthermore, if the difference in cell voltage is too severe between the cells, i.e. the range between the lowest cell voltage and the highest cell voltage exceeds a predetermined voltage cell spread range, there may be an unbalance in the battery system which may be caused by the battery having been used for too long without balancing have been performed to the battery, or that the battery has rested for too long without having been used, etc. However, it is difficult to ascertain if there is an unbalance in the battery system or not and the result from a state of health calculation may thus not be considered reliable enough since it is difficult to know that the result of the calculation correspond to the true characteristic of the battery. Hence, the battery cells need to be sufficiently balanced before state of health calculation is executed.

According to an example embodiment of the present invention, the method may further comprise the step of calculating a state of charge value for each battery cell by means of the received parameter values.

Hereby, the measured parameter may be used for calculating the battery state of charge and the method may thus thereafter determine if the calculated state of charge is reliable or not. A further parameter is thus provided for determining if calculation of state of health of the battery should be executed or not.

According to an example embodiment of the present invention, the at least one predetermined parameter criterion may be that the calculated state of charge value for each of the battery cells are within a predetermined range.

For the same reasons as described above, if the state of charge of the different cells of the battery is outside a specific range, it may be an indication that a calculation of the state of health of the battery will not provide a sufficiently accurate state of health of the battery, i.e. an unreliable result. It may also be an important aspect for other measured parameters that the state of charge for the different battery cells is at approximately the same level of state of charge.

According to an example embodiment of the present invention, the at least one predetermined parameter criterion may be that the deviation from a mean value of the calculated state of charge values for the battery cells are within a predetermined range.

According to a second aspect of the present invention there is provided a system connectable to a battery comprising a plurality of battery cells, the system comprises a control unit which is configured to: receive, for a state of health parameter, a plurality of measured parameter values for the battery; compare the measured parameter values with at least one predetermined parameter criterion; and determine that the measured state of health parameter values are reliable if the state of health parameter values fulfil the at least one predetermined parameter criterion.

Effects and features of this second aspect are largely analogous to those described above in relation to the first aspect of the present invention.

According to a third aspect of the present invention there is provided a computer program comprising program code means for performing the steps of the above described method when the program is run on a computer.

According to a fourth aspect of the present invention there is provided a computer readable medium carrying a computer program comprising program code means for performing the steps of the above described method when the program is run on a computer.

Effects and features of the third and fourth aspects of the present invention are largely analogous to those described above in relation to the first aspect of the present invention.

Further features of, and advantages with, the present invention will become apparent when studying the appended claims and the following description. The skilled person realize that different features of the present invention may be combined to create embodiments other than those described in the following, without departing from the scope of the present invention. For example, the various parameter criteria described above can either be used alone or in combination with other criterion when determining if it is suitable or not to calculate battery state of health.

BRIEF DESCRIPTION OF THE DRAWINGS

The above, as well as additional features and advantages of the present invention, will be better understood through the following illustrative and non-limiting detailed description of exemplary embodiments of the present invention, wherein.

DETAILED DESCRIPTION

Figure 1:
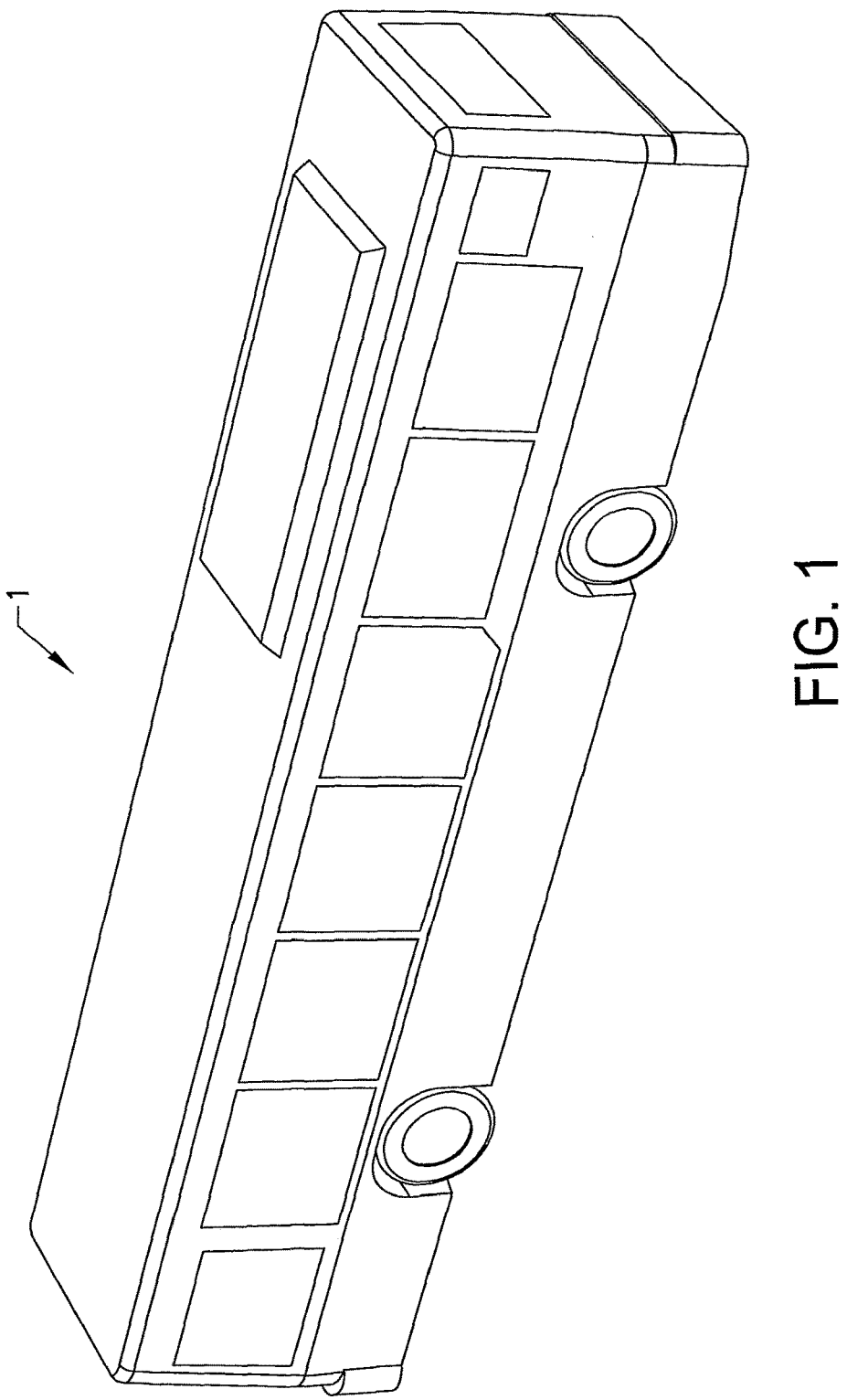
FIG. 1 is a side view illustrating an example embodiment of a vehicle provided with a battery that can utilize the method for determining if the state of health parameter values are reliable.

The present invention will now be described more fully hereinafter with reference to the accompanying drawings, in which exemplary embodiments of the invention are shown. The invention may, however, be embodied in many different forms and should not be construed as limited to the embodiments set forth herein; rather, these embodiments are provided for thoroughness and completeness. Like reference character refer to like elements throughout the description.

With particular reference to FIG. 1, there is provided a vehicle 1 provided with a battery (not shown). The battery comprises a plurality of battery cells which can be charged and discharged depending on the specific battery operating mode. The vehicle 1 depicted in FIG. 1 is a bus for which the inventive method for determining the reliability of state of health parameter values, which will be described in detail below, is particularly suitable for.

Figure 2:
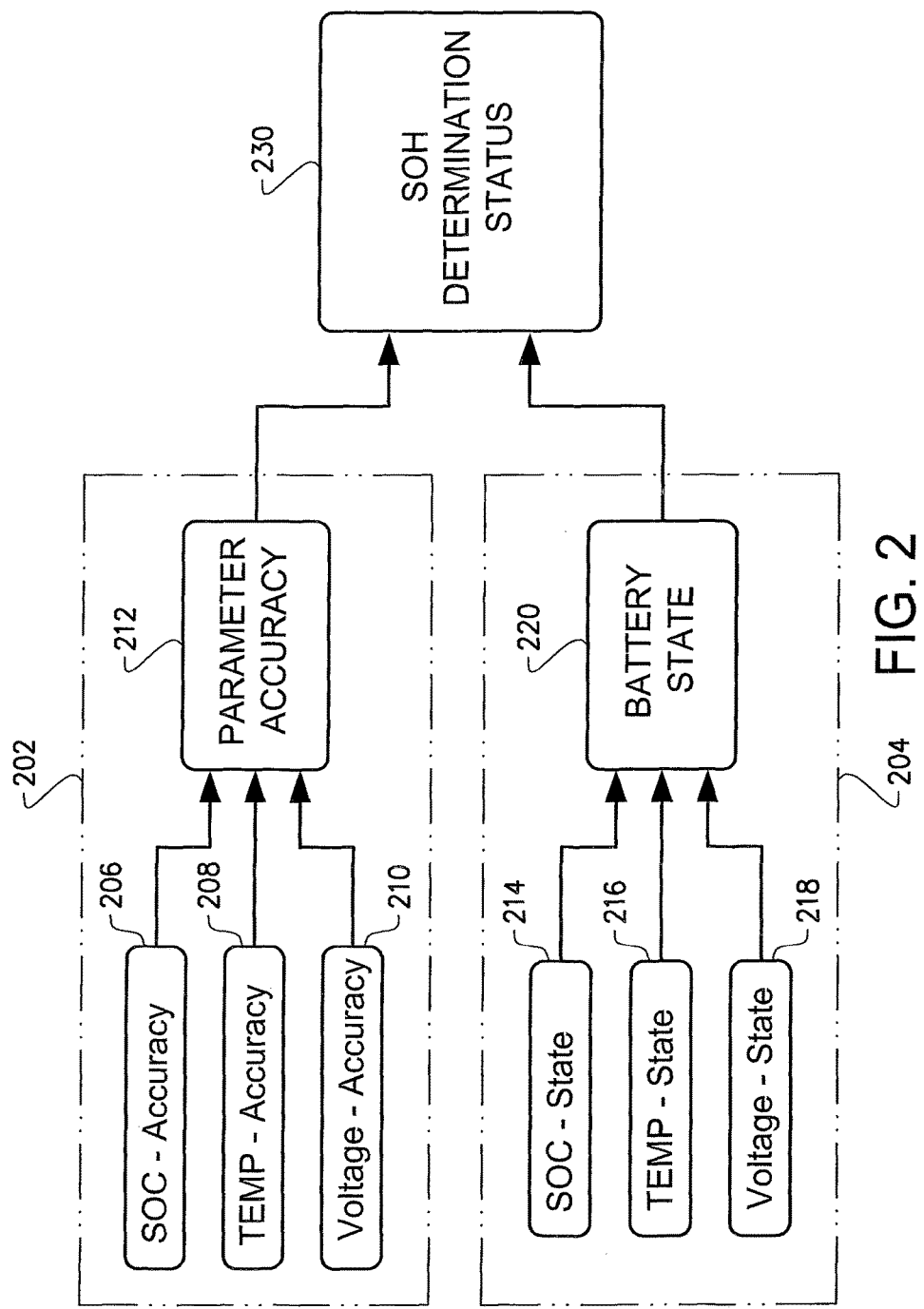
FIG. 2 is a flowchart of an example embodiment for determining if it is reliable to calculate battery state of health.

Turning now to FIG. 2, there is provided a flowchart of an example embodiment for determining if it is reliable to calculate battery state of health. The flowchart in FIG. 2 comprises a first part which relates to the present accuracy of the state of health parameter values, referred to in the following as the parameter accuracy status module 202, and a second part which relates to present state of the state of health parameter values, referred to in the following as the parameter state status module 204.

Starting with the parameter accuracy status module 202, it comprises, according to the non-limiting example embodiment depicted in FIG. 2, a state of charge accuracy status 206, a temperature accuracy status 208, and a voltage accuracy status 210. The main purpose of the parameter accuracy status module 202 is to determine if the measured, or calculated, parameters are accurate enough when the measurement, or calculation, was made.

The state of charge accuracy status 206 of the parameter accuracy status module 202 relates to the accuracy of calculated state of charge parameter values which can be used in the calculation of state of health of the battery. The state of charge of the battery can be calculated by a measured voltage value, a measured electric current value, or a combination of a measured voltage value and a measured electric current value. An example of a voltage-state of charge curve is given in connection to the description of FIG. 3 below, illustrating state of charge for an open cell voltage curve. The determination of state of charge accuracy is thus dependent on how accurate the measured voltage and/or electric current was. The following will describe factors that affect the accuracy of voltage values, electric current values, as well as the combination of voltage and electric current values.

Starting with voltage values, one parameter that is decisive when determining if the voltage value is accurate enough is in which state of charge region the voltage value was measured. These regions will be described further in relation to FIG. 3 below.

Another parameter that affects the accuracy of the measured voltage value is when the voltage measurement was made, or more particularly, for how long time the battery has "rested" since it was previously electrically charged or discharged.

Hereby, the measured voltage value is considered less accurate if the time period since the battery was charged/discharged is within a certain time period before the voltage measurement was made, i.e. the voltage measurement was executed to close in time from the previous charging/discharging of the battery. Hence, the measured voltage value changes in relation to the electric current which is charging/discharging the battery. If the battery is charged with electric current, the measured voltage value will thus not represent the true state of the battery and as such be considered unreliable. Also, the voltage value will need some time to converge to its "true" value after charging/discharging of the battery is executed.

Furthermore, the measured voltage value is also dependent on the battery temperature at the time when the measurement was made. For example, an increased temperature will increase a resistance of the battery and thus, for a constant electric current, provide a measured voltage value which is higher than what may be the real situation. Hence, if the temperature of the battery is not within a specific range when the measurement was made, the voltage value is not considered accurate. Also, if the temperature difference between the battery cells is not within a specific temperature range, the measured voltage value may be higher or lower than what would be the case if the temperature of the cells is within the specific temperature range. Further, and described above, the temperature of the battery cells should not vary too much during the period when the temperature measurement is made, i.e. a relatively steady state of the temperature is preferable to be able to calculate a reliable battery state of health.

Moreover, the accuracy of the voltage values may also be dependent on the spread in voltage values between the battery cells. If the difference between the largest cell voltage and the lowest cell voltage is outside a predetermined acceptable voltage range, the overall measured battery voltage may be determined not to be accurate.

When it comes to determining if a measured electric current is accurate or not, other parameters may also be of importance for providing a reliable state of health calculation. For example, it may be relevant to check if the battery was charged or discharged with electric current at the moment when the electric current measurement was made. Also, if the electric current was measured when the electric current was less stable, i.e. electric current measurements tend to fluctuate over time, the electric current measurement is considered not to be accurate. Another parameter relating to accuracy of electric current is the sum of integrated electric currents for all the battery cells. This may be of interest when using the integrated electric current values for calculating state of charge when the voltage-state of charge derivative function is below a predetermined threshold value. Naturally, also the temperature is an important aspect for determining if the measured electric current is accurate or not for the same reasons as described above.

Finally, when determining if a state of charge, which is calculated by means of both voltage and electric current, is accurate, it may be important to determine that a combination of the above described parameters for voltage and electric current is accurate.

Accordingly, with at least some of the above described parameters, it can be determined if a calculated state of charge accuracy status 206 is sufficiently accurate.

Turning to the temperature accuracy status 208, this accuracy status relates to the accuracy of the measure temperature of the battery, which can be used for calculating the state of health of the battery. As described above, the temperature of the battery may be an important aspect when determining if other parameters, such as measured voltage and electric current are accurate. The temperature parameter itself may however also be provided in a state of health calculation and its accuracy may therefore be important to consider before calculating battery state of health.

There are a number of aspects that can be considered when determining if a measured temperature of the battery is accurate or not. For example, the temperature measurement may be considered inaccurate if there are not enough sensors provided to the battery, i.e. an insufficiently amount of battery cells are provided with a temperature sensor. For example, it may be determined that at least every other cell should be provided with a temperature sensor in order to provide a temperature measurement which is considered accurate. This is of course dependent on the specific battery as well as the specific application of the battery, for some applications it may be sufficient that every third cell, or even every fourth cell, is provided with a temperature sensor.

The accuracy of the temperature may also be determined by verifying that the difference between the largest temperature of the battery cells and the lowest temperature of the battery cells are within a predetermined range, i.e. that a spread of the temperature is within a specific and accepted temperature range. Further, another aspect is that the temperature measured from two adjacent temperature sensors must not differ too much. If this is the case, it may be determined that the temperature measurement is not sufficiently accurate. Still further, the accuracy of the temperature sensors themselves may also be an aspect to consider. If the accuracy of the sensors is not sufficient, then the measured temperature value is thus not considered accurate. As a final example of the temperature accuracy, if the change of temperature over time changes too rapidly or too slowly, then a temperature measurement made during this time period may not be considered sufficiently accurate to be used in a state of health calculation.

It should be noted that the temperature of battery cells are often measured on the surface of the cells, or at the pole of the cells. One further aspect to consider is whether the difference in temperature between the core of the cells and the surface of the cells are such that a measured temperature on the surface of the cell, or the pole of the cell, sufficiently describes the "true" temperature of the cells. This may be the case if the measurement is made too close in time since the battery was charged or discharged. Since it is the cell core that is heated and the cell surface that is cooled, it will be difficult to assess whether the measured temperature on the surface describes the true characteristic of the cell temperature. Hereby, in order to determine that the dynamically measured temperature is accurate, the measurement should preferably be made a time period after the battery has been charged/discharged with/from electric current. Further, the core of the cells may have a higher temperature then the surface of the cells in cases where the battery has been exposed to "severe" charging/discharging, after which it takes a time period until the temperature of the cells and the surface have converged to substantially the same temperature level.

Accordingly, with at least some of the above described parameters, it can be determined if a measured temperature accuracy status 208 is sufficiently accurate.

Turning now to the voltage accuracy 210, this accuracy status relates to the accuracy of measured voltage values for the different cells. The accuracy of the measured voltage value may be dependent on the specific temperature at the time of the measurement. Accordingly, if the temperature is too high when measuring the battery voltage, the measured voltage value may not be considered reliable or accurate enough to provide a reliable value when calculating battery state of health. Also, other parameters affecting the accuracy of the measured battery voltage is e.g. in which open cell voltage area the measurement was made, as described further below in relation to FIG. 3, or the time period since battery was previously charged/discharged, as described above, etc.

With the state of charge accuracy 206, the temperature accuracy 208 and the voltage accuracy 210, a parameter accuracy value 212 can be provided.

Accordingly, if it is determined in 206 that the calculate state of charge is accurate, that the temperature measurement in 208 is accurate and that the voltage in 210 is accurate, then the battery parameter values are considered accurate.

It should however be readily understood that a parameter accuracy value 212 indicating that the battery parameters are accurate can be provided by means of only one of state of charge accuracy 206, temperature accuracy 208 or voltage accuracy 210, it is not a prerequisite that all accuracy values are provided for receiving a parameter value indicating an accuracy of the battery. As described above, different parameters are more important for some applications than for others and it may therefore only be important to consider the specific parameters which are important for the specific applications.

Turning now instead to the battery state status module 204, it comprises a state of charge state 214, a temperature state 216, and a voltage state 218. The main purpose of the battery state status module 204 is to be able to determine if the state of the battery is such that it is beneficial to calculate the battery state of health.

Accordingly, the battery state status module 204 determines if the level of the parameter values will provide a calculated state of health value that is substantially reliable, i.e. substantially accurate. To be able to determine how much a battery has aged, the parameter value that is measured and used in calculating the aging of the battery needs to be compared to a reference parameter value when the battery was new. When the battery was new, measurement of various parameters was made under certain circumstances and it is therefore of interest to keep track of the circumstances that influence the parameters for determining the aging of the batteries, in order to assure that a reliable result of the calculation of the battery state of health is provided.

Firstly, the state of charge state 214 determines if a calculated state of the state of charge is such that it will contribute to a reliably calculated state of health value, i.e. that the state of charge is reliable. The state of charge state may be determined to be reliable if, for example, the state of charge value is calculated when the derivative function, as described below, is above a predetermined threshold value.

The temperature state 216 determines if the state of the measured temperature is such that it will contribute to a reliably calculated state of health value. The measured temperature value may be determined to be reliable if the mean value of the measured temperature is within a specific range, i.e. the battery was neither too warm nor too cold when the measurement was made. Also, the individual cell temperatures should not deviate too much from the mean temperature of battery in order for their value to be considered reliable.

Finally, the voltage state 218 determines if the measured voltage is such that it will contribute to a reliably calculated state of health value for the battery. When studying the voltage values it can be determined that voltage values are reliable if the voltage measurement was made within a predetermined time period since the previous balancing of the battery was executed. Hence, a voltage value can be considered reliable if the spread between the voltage values of the different cells are within a predetermined voltage range. Studying the range of the battery cell voltage can be an important aspect since e.g. a similar mean value can be provided for two measurements but where the spread between the highest and lowest battery cell voltage differs significantly between the measurements. Hereby, only the voltage mean value having a cell voltage spread within the predetermined range is considered reliable. Accordingly, the voltage values may be considered reliable shortly after balancing of the battery have been executed, since the spread in voltage will be reduced after battery balancing.

Also, the voltage value may be considered unreliable if it is either too high or too low. More specifically, if the level of the voltage value of a cell is too high or too low, this may probably indicate that the cell in question is damaged. Hereby, calculating state of health of the battery based on a voltage value when one cell, or a plurality of cells, is broken, will not provide a sufficiently reliable state of health value.

Further, for the state of charge state 214, the temperature state 216 and the voltage state 218, it may also be of interest to determine the spread of the values for each of the parameters, i.e. how a cell value deviates from the other cell values, or from a calculated mean value of the cells, etc.

With the above states 214, 216, 218 of the battery, the battery state module 220 determines whether the battery state is beneficial for providing a reliable state of health calculation by using the above described parameters.

Furthermore, it should be understood that the battery state module 220 is not necessarily dependent on receiving the state from all of the various parameters, i.e. from the state of charge state 214, the temperature state 216, or the voltage state 218. It may, for the same reasons as described above in relation to the description of the parameter accuracy module 212, be sufficient to receive input from only one of the modules.

Finally, the parameter accuracy module 212 and the battery state module 220 provides their result to a state of health determination status module 230. The state of health determination status module 230 determines, based on the received input from the parameter accuracy module 212 and the battery state module 220, if the measured parameter values are considered reliable for calculating a substantially accurate state of health of the battery.

Although FIG. 2 illustrates that the state of health determination status module 230 should receive input from both the parameter accuracy module 212 and the battery state module 220, the invention should be understood to function equally as well with a state of health determination status module 230 receiving input from only one of the parameter accuracy module 212 and the battery state module 220.

Figure 3:
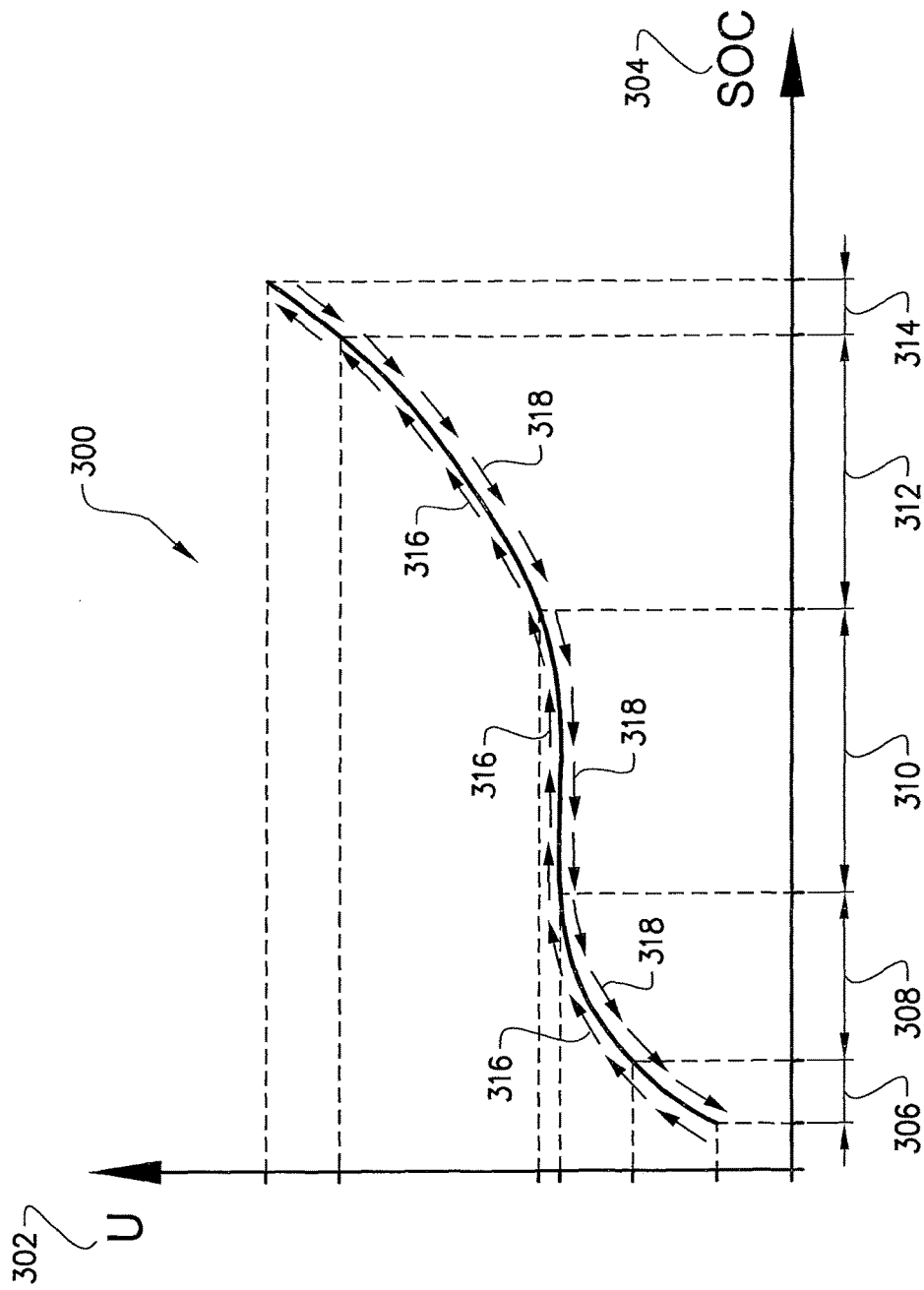
FIG. 3 is an open cell voltage graph illustrating an example of when parameter values are reliable.

Turning now to FIG. 3 illustrating an open cell voltage graph 300. The graph 300 illustrates how the battery voltage 302 depends on the state of charge 304 of the battery. The graph 300 in FIG. 3 is divided into five sections 306, 308, 310, 312, 314. The battery can either be charged, indicated by the arrows 316 showing increased voltage and increased state of charge of the battery, or be discharge, indicated by the arrows 318 showing a decrease in voltage as well as a decrease in state of charge of the battery. The following will mainly describe the graph in a battery charging state, illustrated by the arrows 316.

In the first section 306 the battery is charged from an empty state. Hereby, the derivative function of the voltage-state of charge is relatively steep, i.e. a relatively large increase in voltage 302 in comparison to the increase in state of charge 304. Conversely, when the battery is discharged, the first section 306 indicates that the battery will soon be out of power.

In the second section 308 of the graph 300, the derivative function of the voltage-state of charge has been slightly reduced in comparison to the first section 306, but the voltage 302 of the battery is still increasing with increased state of charge 304 and the voltage level of the battery is still in its lower region with regards to its overall capacity.

In the third section 310 of the graph, the above defined derivative function is approximately zero. Hereby, the state of charge 304 of the battery is in this section still increasing but the voltage level is remaining approximately the same.

In the fourth 312 and fifth 314 sections of the graph, the derivative function has increased such that the battery voltage 302 is increasing and the state of charge 304 is also increasing. In the fifth section 314 the charging level of the battery has almost reached its complete capacity.

Now, as described above in relation to FIG. 2, measuring a voltage value during specific points in time may provide parameter values that cannot be considered accurate enough. In FIG. 3, this is illustrated by the third section 310 where the derivative function is approximately zero. More specifically, if a voltage measurement is made when the battery state of charge is in the third section 310, the accuracy of the corresponding state of charge of the battery will be relatively uncertain, since a small change in voltage 302 will provide a relatively large change in state of charge 304. Accordingly, in the third section 310, it may be difficult to provide an exact, or approximately exact, state of charge value with the measured voltage value, thus making the measured voltage value, as well as the state of charge value inaccurate at the third section 310. In the first 306, second 308, fourth 312 and fifth 314 sections of the graph 300, the derivative function is above a predetermined accepted threshold value and a measured voltage value will correspond to a relatively precise state of charge value. Hereby, the measured voltage value as well as the corresponding state of charge value is in these sections considered accurate enough for providing a reliable state of health calculation.

Furthermore, the state of charge value can thus be considered reliable if the state of charge calculation was executed at a point in time when it was beneficial to do so, i.e. in one of the first 306, second 308, fourth 312 or fifth 314 sections described above.

However, although the measured voltage value and the corresponding state of charge value is considered accurate, other parameter values may result in that it is determined not to perform a state of health calculation. For example, although the voltage-state of charge is in one of the first 306, second 308, fourth 312 or fifth 314 sections of the graph 300, other parameters such as the temperature may have such a large spread between the cells that it is determined that this will render a calculated state of health unreliable. Other parameter values that may result in the decision of not performing a state of health calculation is given above in relation to FIG. 2.

Figure 4:
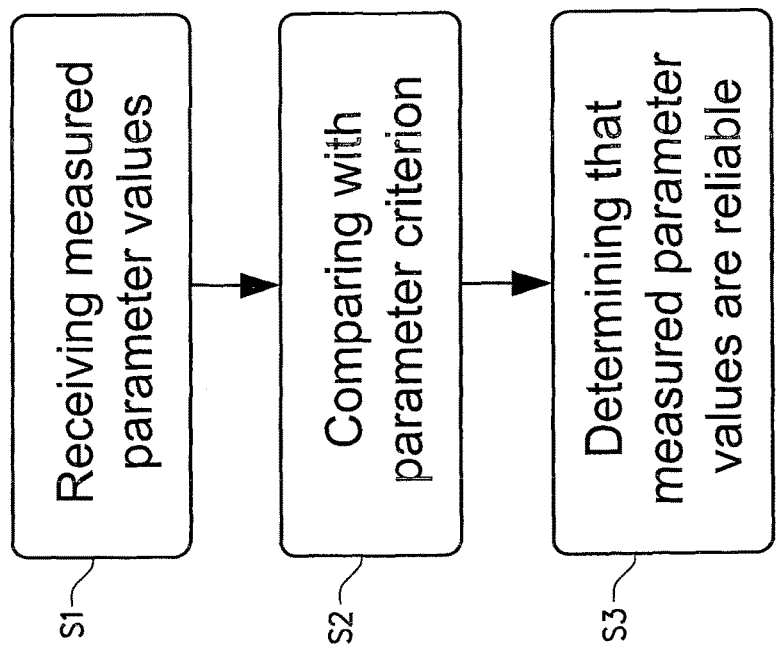
FIG. 4 is a flowchart of an example embodiment of the method for determining the reliability of state of health parameter values.

In order to summarize the inventive method according to the present application, reference is made to FIG. 4 illustrating a flowchart of an example embodiment of the method according to the present invention. According to the example depicted in FIG. 4, a first step S1 of the method is to receive measured state of health parameter values from the battery. The measured state of health parameter values can, for example, be any one of those described above in relation to the description of FIGS. 2 and 3. The measured state of health parameter values relate to parameter that can be used when calculating state of health of the battery.

Thereafter, the measured state of health parameter values are compared S2 with at least one parameter criterion. The at least one parameter criterion is described above and can be set differently for different parameters as well as for different fields of application for the battery.

Finally, it is determined S3 that the measured state of health parameter values are reliable if the state of health parameter value fulfils the at least one predetermined parameter criterion. Hereby, the method can further determine if a state health parameter calculation, which is to be based on the received measured state of health parameter values, will provide a result which is accurate or not, i.e. if the result from the calculation will indicate a state of health of the battery which will substantially correspond to the true behaviour of the battery.

It is to be understood that the present invention is not limited to the embodiments described above and illustrated in the drawings; rather, the skilled person will recognize that many changes and modifications may be made within the scope of the appended claims.

The invention claimed is:

1. A method for determining if a reliable state of health for a battery comprising a plurality of battery cells can be calculated, the method comprising the steps of:
calculating a state of charge value for the battery by means of at least one of a received measured voltage value or a received measured electric current value;
comparing the at least one of the received measured voltage value or the received measured electric current value with at least one predetermined parameter criterion for at least one of measured voltage or measured electrical current;
determining that the calculated state of charge value is accurate if the at least one of the received measured voltage value or the received measured electric current value fulfils the at least one predetermined parameter criterion;
receiving a measured temperature value of the battery;
determining that the measured temperature value is accurate if a difference between the largest temperature of a battery cell and the lowest temperature of a battery cell is within a predetermined range;
determining that the measured voltage value is accurate if measured when the absolute value of the derivative function dy/dx is above a predetermined threshold limit, where:

y=a measured voltage of the battery; and
x=a calculated state of charge of the battery;
determining that the parameters for calculating state of health are accurate if the calculated state of charge, the measured temperature and the measured voltage value are determined accurate; and
determining that a reliable state of health can be calculated if the parameters for calculating state of health are determined accurate;
calculating a reliable state of health for the battery after determining that a reliable state of health can be calculated; and
controlling operation of the battery for optimized capacity in response to the calculated reliable state of health for the battery.

2. The method according to claim 1, wherein the state of health parameter is cell voltage of the battery, such that a plurality of measured battery cell voltages is received.

3. The method according to claim 2, wherein the at least one predetermined parameter criterion is that the measured cell voltage of each of the battery cells are below a predetermined upper voltage limit.

4. The method according to claim 2, wherein the at least one predetermined parameter criterion is that the measured cell voltage of each of the battery cells are above a predetermined lower voltage limit.

5. The method according to claim 1, further comprising the step of calculating a state of charge value for each battery cell by means of the received parameter values.

6. The method according to claim 5, wherein the at least one predetermined parameter criterion is that the calculated state of charge value for each of the battery cells are within a predetermined range.

7. The method according to claim 5, wherein the at least one predetermined parameter criterion is that the deviation from a mean value of the calculated state of charge values for the battery cells are within a predetermined range.

8. The method according to claim 1, wherein the at least one predetermined parameter criterion is that the values of the plurality of measured parameter values are within a predetermined range.

9. The method according to claim 8, wherein the predetermined range is measured from a mean value of the measured parameter values.

10. The method according to claim 1, further comprising the steps of:
determining that the state of the state of charge is reliable if the state of charge was calculated when the derivative function dy/dx is above the predetermined threshold limit;
determining that the temperature state is reliable if a mean value of the measured temperature of the battery cells is within a predetermined temperature range;
determining that the measured voltage value is reliable if a mean voltage value of the battery cells are within a predetermined voltage range; and
determining that the state of the battery provides a reliable calculation of state of health if the state of charge, the temperature and the voltage value are determined reliable.

11. The method according to claim 1, wherein the at least one predetermined parameter criterion is that a mean temperature of the battery cells is within a predetermined temperature range.

12. The method according to claim 1, wherein the at least one predetermined parameter criterion is that the measured parameter values was received a predetermined time period alter a previous charging/discharging of the battery were executed.

13. The method according to claim 1, wherein the state of health parameter is cell temperature of the battery, such that a plurality of measured battery cell temperatures is received.

14. A computer comprising a program for performing the steps of claim 1 when the program is run on the computer.

15. A non-transitory computer readable medium carrying a computer program for performing the steps of claim 1 when the program is run on a computer.

16. A system connectable to a battery comprising a plurality of battery cells, the system comprises a control unit which is configured to:
  calculate a state of charge value for the battery by means of at least one of a received measured voltage value or a received measured electric current value;
  compare the at least one of the received measured voltage value or the received measured electric current value with at least one predetermined parameter criterion for at least one of measured voltage or measured electrical current;
  determine that the calculated state of charge value is accurate if the at least one of the received measured voltage value or the received measured electric current value fulfils the at least one predetermined parameter criterion;
  receive a measured temperature value of the battery;
  determine that the measured temperature value is accurate if a difference between the largest temperature of a battery cell and the lowest temperature of a battery cell is within a predetermined range;
  determine that the measured voltage value is accurate if measured when the absolute value of the derivative function $dy/dx$ is above a predetermined threshold limit, where:
  $y$=a measured voltage of the battery; and
  $x$=a calculated state of charge of the battery;
  determine that the parameters for calculating state of health are accurate if the calculated state of charge, the measured temperature and the measured voltage value are determined accurate; and
  determine that a reliable state of health can be calculated if the parameters for calculating state of health are determined accurate;
  calculate a reliable state of health for the battery after determining that a reliable state of health can be calculated; and
  control operation of the battery for optimized capacity in response to the calculated reliable state of health for the battery.

* * * * *